US005384464A

United States Patent [19]
De Fornel et al.

[11] Patent Number: 5,384,464
[45] Date of Patent: Jan. 24, 1995

[54] PROCESS AND APPARATUS FOR OPTICAL NEAR FIELD MICROLITHOGRAPHY

[75] Inventors: Frederique De Fornel; Jean-Pierre Goudonnet, both of Dijon, France; James Mantovani, Stateboro, Ga.

[73] Assignee: SIM (Societe d'Investissement dans la Microscopie) S.A., Auxerre, France

[21] Appl. No.: 842,184

[22] PCT Filed: Sep. 21, 1990

[86] PCT No.: PCT/FR90/00682
§ 371 Date: May 7, 1992
§ 102(e) Date: May 7, 1992

[87] PCT Pub. No.: WO91/04513
PCT Pub. Date: Apr. 4, 1991

[30] Foreign Application Priority Data
Sep. 22, 1989 [FR] France .............................. 89 12497

[51] Int. Cl.6 ......................................... H01J 37/304
[52] U.S. Cl. .............................. 250/492.2; 250/491.1
[58] Field of Search .......................... 250/492.2, 491.1

[56] References Cited
U.S. PATENT DOCUMENTS
5,214,282 5/1993 Yamaguchi et al. ............. 250/492.2

Primary Examiner—Jack I. Berman
Attorney, Agent, or Firm—Sandler, Greenblum & Bernstein

[57] ABSTRACT

Direct scanning microlithography process of a substrate such as a wafer, by means of an optical and/or electronic beam, for obtaining photomechanical or electromechanical lithography of submicrometric structures at the surface of the substrate, wherein the source of the optical and/or electronic beam used for lithography is kept at an appropriate distance from the substrate by means of a waveguide proximity probe, such as a fiber optic proximity probe capable of measuring rapid variation, depending on the distance, of the intensity of an electromagnetic wave reflected by the substrate within the near field area located at the end of the probe. The invention also concerns microlithography devices using this process.

10 Claims, 3 Drawing Sheets

PROCESS AND APPARATUS FOR OPTICAL NEAR FIELD MICROLITHOGRAPHY

BACKGROUND OF THE INVENTION

1. Field of the Invention

The invention concerns a microlithography process for the realization of superficial submicrometric structures on a wafer type substrate, and a device using it.

2. Discussion of Background Information

The manufacturing process of integrated circuits, and especially very large scale integration circuits (also called VLSI), includes a series of phases aiming to obtain complex etched structures on a wafer, namely:

- the superficial oxidation of the silicium to obtain a thin layer of silicon dioxide.
- the deposit of a layer of material resistant to radiation, such as an ultraviolet light for example, an electron beam or an X-ray beam.
- impression of a latent image on this material by a microlithography technique, such as, for example, the masking technique.
- amplification of this latent image by an appropriate development method, the reserve areas delimiting the design to be realized on the silicium.
- stabilization of this image by an appropriate fixing method, or a lithography method, for example, using plasma.
- ionic irradiation of the silicium through the openings obtained in the silicon dioxide (to obtain areas variously doped in the silicium).

All the stages of the manufacturing process can be repeated several times, the microlithography being, each time, the decisive phase in the obtaining of submicrometric figures with a good yield.

Amongst the known microlithographic techniques, the most used is photomasking or printing by projection; the designer of the integrated circuit has realized a series of opaque masks which will be used successively to obtain special designs on a photoresist (negative resist to obtain transparent designs, or positive resist to obtain opaque designs). Exposure is preferably realized with a short wavelength light of the ultraviolet light type. The positioning or repositioning of opaque masks on a wafer is a delicate operation, their respective alignment having to be very strict. Moreover, during exposure, the contact between the resist and the mask should be intimate, so as to avoid any shadow, which requires an accurate control of the dimentional deformations of the wafer and the mask. This technique allows the making on the wafers of designs, the resolution of which is close to 0.5 micrometers with a positive electroresist (the resolution of a negative resist being far poorer).

Beyond this point, i.e., if one wishes to obtain a design with a lower resolution, and try and reach in particular the limit of 0.1 micrometers, which is considered as being the limit fixed by semiconductor physics, the wavelength of an ultraviolet light is too great. That is why we developed non-optical microlithography techniques, based on the use of an electron or an X-ray beam, directly scanning, or "irradiating" through an appropriate mask, a resist sensitive to these rays. The best resolution obtained to date is close to 0.3 micrometers.

These latter techniques nevertheless still have serious inconveniences.

This is especially the case for the direct lithography of a resist by a beam of monokinetic electrons of appropriate energy; while this technique does not require the use of a mask, it is limited in resolution by often unacceptable secondary phenomenae. Indeed, there is an emission of secondary electrons when the electron beam hits the surface of the resist and that of the silicium. The resulting backscattering of electrons tends to thicken the etched designs, and in particular the lines traced, and to raise the exposure level of the bottom of the layer of resist and, in addition, to create a proximity effect between adjacent designs, requiring the calculation of corrective factors during exposure. The exposure therefore depends on the thickness of the resist, according to parameters difficult to control.

Non-optical lithography by soft X-rays (energy varying from 280 to 1000 eV) is a technique by projection through extremely fine masks which will undoubtedly enable to reach an ultimate resolution (0.1 micrometers). This technique does not have the inconveniences, previously mentioned, of the direct design by a beam of electrons, but it is necessary to realign the masks on the wafer at each stage of the manufacturing process of the integrated circuits, and the time required for these operations can be long.

Finally, we know of a very recent lithographical context, not yet having reached the stage of industrialization due to reasons explained hereafter. This process consists in keeping a source of light at a small distance from the wafer surface. To do this, a proximity probe, directly derived from the scanning tunneling microscope, is placed next to the beam source. We know that such a proximity probe allows to keep distances as small as approx. 10 angströms between a conductive tip and a surface. At such a distance, a specific beam source— generally an ultraviolet light beam source—emits a slightly diffracting beam; the microlithography of a resist is then quite precise and the resolution is greatly improved without the need of techniques using very short wave lengths (monokinetic electron or X-ray beams).

This process is however difficult to set up, for several reasons:

- first of all, the radiation source and the proximity probe are mutually offset, so the distance between the source and the resist surface to be exposed cannot be controlled with any precision. Because of the size of this distance (a few angströms), and the nanoscopic irregularities on the surface, this displacement may cause the source to come into contact with this surface, leading to its deterioration.
- then, the electronic nature of the tunnel effect proximity probe used makes it necessary for the surface to be kept at a distance, to be a conductor. If it is necessary to use a photoresist, a conducting layer should be provided on this resist, which is a great inconveniency as it complicates the process. If, on the other hand, an electroresist is used, the surface will be a conductor, but it is then necessary to use electronic lithography or X-rays. But the X-ray sources, like the electron sources need to be electrically polarized, in relation to the surface to be etched, in order to be operational. This polarization hinders, or sometimes even prevents, the measurement of the very low intensity current flowing between the probe and the tunnel effect electronic probe.

finally, the chemical nature of the resist changes during etching. Since the current collected by the tunnel effect probe varies somewhat with this chemical nature, the proximity control can no longer be reliable.

SUMMARY OF THE INVENTION

The aim of this invention is to eliminate these inconveniences in that it procures a direct scanning microlithography of a substrate such as a wafer, by means of an optical and/or electronic beam. This process is characterized in that the optical and/or electronic source of radiation used for the photomechanical or electromechanical etching of submicrometric structures on the surface of the said substrate, is kept at an appropriate distance from it by means of a waveguide proximity probe such as a fiber optic proximity probe. Such a probe is capable of measuring the rapid variation of the intensity of an electromagnetic wave, emitted from the end of the fiber and reflected in return by the substrate, depending on the distance. This phenomenon is sensitive within the area called near field, situated close to the end of the emitting fiber, i.e., for distances not exceeding approx. ten wavelengths of the electromagnetic wave used for measuring.

A waveguide proximity probe, such as advised in the invention, is described namely in the application for a French Patent No. 89-11 297, filed on Aug. 28, 1989 in the Applicant's name under the title "Near Field Reflecting Microscope using a waveguide as a probe of this field".

The use, according to the invention, of an optical proximity probe enables the inconveniences of the microlithography devices, known to date, to be overcome. Moreover, the lithography of the resist may be carried out optically or electronically, without interfering with keeping the source at a distance by means of the probe. Finally, in certain variants of the invention, the lithography of the resist can be carried out on the spot where the distance measurement is taken, between the radiation source and a surface practically parallel to the surface of the resist.

We will now mention the working principle of a fiber type near field optical proximity probe. A fiber optic, coupled in an appropriate way to an electromagnetic source of radiation (such as for example a narrow band electroluminescent diode), emits from its end an electromagnetic wave towards a reflecting surface; the made of propagation of this wave results from the guided propagation of the radiation within the fiber. After reflection on the surface, the wave is captured in return by the fiber, where it is propagated according to a guided mode to the receiver which measures its intensity. In supposing, as realistically as possible, and justified namely by experience, that the wave captured in return by the fiber comes from a virtual fiber optic, symmetrical with the first fiber in relation to the plane limited by the reflecting surface, it has been shown that the intensity collected by the receiver is proportional to the coupling between the made of propagation of the wave reflected in the air (and "emitted" by the virtual fiber) and the main made of propagation within the proximity probe fiber. It is then noted that there is a very quick decrease in the intensity of the wave detected according to the distance existing between the end of the said fiber and the reflecting surface.

This phenomenon is already exploited in the application for a French patent No. 89-11 297 mentioned above to obtain, by scanning, the topography of a surface to be examined or localized spectroscopic information on this surface. It has also been shown that the vertical and lateral resolutions of such a device used for microscopy can respectively reach values close to 10 nanometers and 50 nanometers. Moreover, the decrease of the intensity is still noticable (and therefore usable) for a distance of several micrometers.

In accordance with the process, object of this invention, it is therefore possible to scan and etch the surface of a radiation resist, by keeping the source of this radiation at a distance varying between several tens of nanometers and several micrometers; the risks of collision between the source and the resist are thus notably reduced. In addition, the lateral scanning resolution is highly sufficient, since, on a wafer, the object is to obtain designs, the size of which exceeds 100 nanometers.

Moreover, no metallization of the surface is required for the working of the proximity probe. The resist deposited on the wafer can therefore be of any kind: photoresist or electroresist. In addition, its thickness playing no part vis-à-vis the proximity control, it becomes very profitable to deposit very thin layers of resist which improves resolution and reduces exposure times.

According to a first variant of the process in accordance with the invention, the microlithography is carried out on the substrate, such as a wafer, by the photomechanical microlithography of a photoresist previously deposited on this substrate, the wave length of the light used for this purpose being very different from wavelength of the electromagnetic wave used for keeping the source of the light close to the surface to be exposed by means of the fiber optic proximity probe.

It is possible, for example, with commonly used photoresists, to etch submicrometric designs using an ultraviolet light (wavelength under 400 nanometers). These resists are also transparent to radiations close to infrared or red and in particular to the wave emitted by a Helium-Neon laser, the wave length of which is 6328 angströms. A red light can thus be used for operating the fiber optic proximity probe and etch the photoresist in a traditional way with an ultraviolet light. Profitably, the red light crossing the layer of resist, the control of the distance between the end of the probe fiber and the resist surface is indirect; the reflecting surface used as reference for keeping the distance is therefore formed by the interface between the substrate and the resist deposited on it. We are freed in this way:

from irregularities in the deposit of resist on the substrate, on one hand, and from a change in the chemical nature of the resist when it is exposed, or even from its dimensional changes, on the other hand.

It should be noted that the light used for measuring and the light used for lithography can very advantageously be propagated in the same fiber optic and be emitted to the substrate under the same conditions; this fiber optic is of course that used by the proximity probe. The lithography is therefore realized exactly at a place where the distance is controlled between the source (in this case formed by the end of the fiber optic) and the substrate.

According to a second variant of the process in accordance with the invention, the microlithography of the substrate, such as a wafer, is carried out by the electromechanical lithography of an electroresist previously deposited on this substrate. The electrons are emitted for this purpose by a conducting tip, submitted to the action of an electric field applied between the substrate and the said tip. Moreover, the tip is made one with the fiber optic proximity probe by an appropriate means.

This variant of the process according to the invention requires the realization of a source of radiation more complex than the source of light radiation used in the first variant. For example, as it is explained further on, part of the fiber optic proximity probe can be metallized and a protruding lump in this metallization can be used as source of electrons (in this case we would use an emission of electrons called "electron field emission", by submitting the lump to an electric field exceeding $10^9$ V/cm).

In the two above mentioned variants, the scanning of the substrate surface is controlled very precisely by traditional means of lateral displacement. The lithography is realized point by point, straight segment by straight segment and the information required for the displacement may come directly from a computer file describing the patterns to be achieved by the traditional means of an intermediary descriptive language—it can be noted that this technique is comparable to that used for the photocomposition of masks.

BRIEF DESCRIPTION OF THE DRAWINGS

Other characteristics and advantages of the process, object of this invention will be clearer after reading the following description of several microlithography devices, given as non-limitative examples using this process in reference to the drawings; in which.

DETAILED DESCRIPTION OF THE PREFERRED EMBODIMENTS

Figure 1:
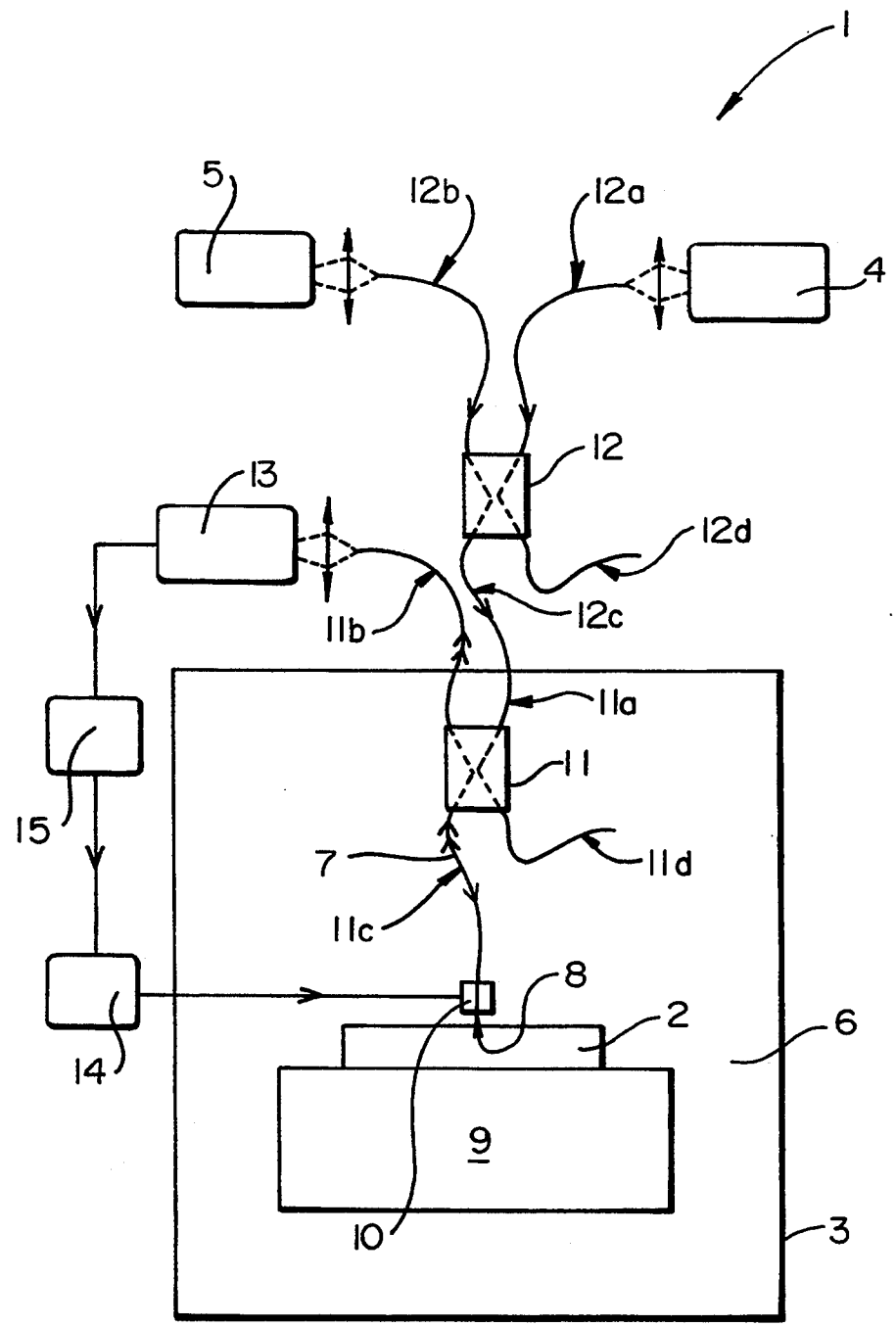
FIG. 1 is a diagram of a microlithography device according to a first variant of the invention.

In compliance with FIG. 1, a first variant of a microlithography device 1 for the achievement of submicrometric structures on a surface such as a wafer substrate 2, includes:
- a tight chamber 3 in which is enclosed, in a clean and controlled atmosphere, a substrate 2 in view of its etching;
- a source of light 4, for example ultraviolet, of the xenon (or mercury, or xenon-mercury) high pressure lamp type,
- a source of light 5, for example, red, of the helium-neon laser type, emitting a monochromatic wave at 6328 angströms.
- a proximity probe 6, working in near field, and including, namely, a fiber optic 7, acting, at its end 8, as an optical probe,
- a traditional anti-vibration support 9, on which the substrate 2 lies. This support 9 may possibly be associated with a traditional scanning means, for example, a micrometric screw, which enables the surface of the substrate 2 to be scanned laterally by the end 8 of the fiber optic 7,
- a traditional vertical positioning means 10 of the end 8 of the fiber optic 7 in relation to the substrate surface 2. This vertical positioning means 10, for example, of the type including a quadrant piezoelectric tube, can also be used for the "fine" lateral displacement (i.e., submicrometric) of the end 8 of the fiber optic 7.
- a first optic coupler 11 with fiber optics, realized for example by a fusion/stretching process. This first optic coupler 11 includes two input transmission channels 11a and 11b and two output transmission channels 11c and 11d. The fiber optic 7 forms the output transmission channel 11c of the coupler 11. The output transmission channel 11d is unused.
- a second optic fiber optical coupler 12 of the same type as the optical coupler 11. This second optical coupler 12 includes two input transmission channels 12a and 12b and two output transmission channels 12c and 12d. The output transmission channel 12c is connected, by an appropriate means, to the input transmission channel 11a of the optical coupler 11. The input transmission channel 12a of the optical coupler 12 is connected to the source of light 4, for example ultraviolet, by a traditional and appropriate means, that may possibly include a set of filters. As for the other input transmission channel 12b, it is connected to the source of light 5, for example red, by another traditional and appropriate means. The transmission channel 12d is unused.
- a photon detector 13, such as for example a photoelectron multiplier, resistant only to the light emitted by the source 5. This detector 13 is connected of the input transmission channel 11b to the optical coupler 11.
- a feedback device 14, connecting the vertical positioning means 10 of the end 8 of the fiber optic 7 to a computer 15, controlling in particular the intensity received by the photon detector 13, the distance between the end 8 of the fiber optic 7 and the substrate surface 2. This computer 15 also enables to control the reciprocal lateral displacements of the substrate 2 and of the end 8 of the fiber 7.

In a traditional way, the substrate 2, such as a wafer, was first of all oxidized on its surface; a layer of silicon dioxide was obtained on its surface, in which we wanted to free areas capable of later being submitted to ionic radiation in view of changing the local electrical characteristics of the silicium.

To achieve this lithography, it is necessary to create on the surface of the substrate 2, areas of reserve which will then be etched by a lithography in liquid phase (for example using an acid), or by dry lithography (for example with plasma). To create these reserve areas, a photoresist is deposited on the layer of silicon dioxide of the substrate 2, and it is exposed depending on the designs to be realized. A precise example will then be given of such a microlithography by means of device 1 of the invention.

After the deposit of the photoresist on the substrate 2, the latter is placed in the tight chamber 3 where the atmosphere is clean and controlled. The working of the microlithography device 1 is then as follows.

A memorized computer file in the computer 15 accurately describes all the designs to be etched on the substrate 2. These designs are mainly formed of straight segments of a given width, the positioning of which on the substrate 2 should be perfect. The exposure process of a straight segment can be detailed as follows:
a) the computer 15 through the intermediary of the traditional lateral scanning means, integrated in the anti-vibration support 9, orders the positioning of the substrate 2 in relation to the end 8 of the fiber optic 7; this first positioning is carried out with micrometric precision. Then, the computer 15 orders the tripping of the source of light 5.

b) The light, originating from this source 5, is propagated within the input transmission channel 12b of the optical coupler 12; then, a given percentage of the intensity of this light (e.g. 50%) is propagated in the transmission channel 12c and all the light originating from the coupler 12 is then propagated in the input transmission channel 11a of the optical coupler 11. A given percentage of the light intensity (e.g. 50%) propagating in the transmission channel 11a is then propagated within the output transmission channel 11c of the coupler 11, formed by the fiber optic 7.

c) Part of the light originating from the source 5 is thus emitted by the end 8 of the fiber 7 towards the surface of the substrate 2 where it is reflected at the interface between the substrate 2 and the photoresist (this is transparent for the wavelength originating in source 5).

d) The backscattered light is collected by the end 8 and is then propagated within the fiber optic 7 in a direction contrary to the direction of emission; a given percentage of this backscattered light (i.e. 50%) passes in this way into the input transmission channel 11b of the coupler 11 where it is collected after possible filtering, by the photon detector 13. The intensity measured by this detector 13 is sent for example in a digital form to the computer 15 where a reference variable is memorized for this intensity. This reference variable represents, in accordance with the proximity measurement principle previously described, the distance required to be kept between the end 8 of the fiber optic 7 and the substrate surface 2. It can be noted, as it is described in the application for a French patent No. 87-11297 mentioned above, that the end 8 of the fiber optic 7 should preferably offer a flat output surface perpendicular to the direction of propagation of the light within fiber 7 and kept parallel to the substrate surface 2 opposite.

e) Depending on the comparison between the intensity collected by the detector and the reference variable, the computer 15 sends a signal to the feedback device 14, so as to act on the vertical positioning means of the end 8 of the fiber optic 7. The proximity probe 6 consequently works by means of a classical feedback.

f) The end 8 of the fiber optic 7 being positioned vertically at the required distance from the substrate 2, the computer 15 then acts through device 14 on the "fine" lateral positioning means, which are integrated by means of vertical positioning 10 to laterally position the end in a fine way. For example, if the vertical positioning means 10 is a quadrant piezoelectric tube, the computer 15 can order device 14 to submit the quadrants to appropriate voltages, to move the end 8 of the fiber 7 sideways with a nanometric precision. The vertical movement is, as mentioned before, obtained with a piezoelectric tube, by submitting the electrode in the tube to a difference in potential in relation to all the quadrants.

g) This previous positioning having been carried out, the computer 15 simultaneously orders the tripping of the source of light 4, e.g. ultraviolet, and the reciprocal displacement of the end 8 of the fiber optic 7 and of the substrate 2 (i.e. the tripping of the means of the micrometric lateral displacement integrated into the anti-vibration support 9 and the tripping of the "fine" positioning means integrated by means of the vertical displacement 10 of the end 8 of the fiber optic 7.

h) The working of this source 4 can be continuous or intermittent, depending on the continuity of the straight segments to be etched on the photoresist. In this case, the light coming from this source 4 is propagated, after filtering, in the input transmission channel 12a of the optical coupler 12, then a given percentage (e.g. 50%) of this light passes into the output transmission channel 12c of the said coupler 12, from where it is reemitted to the input transmission channel 11a of the optical coupler 11. A certain percentage of this light is finally propagated in the transmission channel 11c of the said coupler 11, composed by the fiber optic 7 of the proximity probe 6.

i) part of the light, e.g. ultraviolet, originating from the source 4, is thus emitted to the substrate 2, closeby. The photoresist is then etched according to the design described by the reciprocal displacement of the end 8 of the fiber optic 7 and of the substrate 2. While the etching is being completed, the feedback device 14, thanks to the measurement supplied by the photon detector 13, ensures that the end 8 of the fiber 7 is kept close to the substrate surface 2. This continuous measurement is possible due to the low variations expected from the measured distance, since the surface of the silicon dioxide covering the substrate 2, such as a wafer, presents a roughness of little importance.

It is interesting to note that the working as described above of the microlithography device 1 in accordance with the invention is particularly advantageous. Thus, it was noted that it is possible to etch a photoresist previously deposited on a substrate 2 without having to metallize the substrate 2. The source emitting the etching light to the substrate 2 is kept by a purely optical means and the working of the proximity probe 6 is totally separate from that of the lithography; no interference between the two workings is then to be feared. In addition, due to the fact that the etching is carried out precisely at the place where the proximity measurement is carried out, there cannot be any offsetting between the measurement and the lithography.

In this way, we were able to prepare a wafer sample which, after superficial oxidation for the realization of a thin layer of protective silicon dioxide was cleaned traditionally with appropriate solvents. A dehydratation annealing of the wafer was then carried out at 200° C. We then used the process and the products recommended by the American firm Shiplet Company Inc., who are an authority in the field of this invention. After annealing, we spread over the wafer surface an adhesion promotor to be found in shops under the name of "Microposit Primer"; this product greatly improves the adhesion of the resist to the silicon dioxide surface. Then, a positive photoresist to be found in shops under the name of "Microposit 3000 Resist" was applied; this resist can be exposed by an ultraviolet radiation of approx. 3000 angströms (300 nanometers). This radiation is propagated without difficulty in the silicon dioxide fiber optics used for realizing optical couplers such as the couples 11 and 12 (the wavelength below which a radiation is no longer propagated within a silicon dioxide or quartz fiber is 180 nanometers). It should be noted that the applying of the photoresist on the wafer was carried out during the liquid phase on a whirler such as that included in the system to be found in the shops under the name of "System 6000" manufactured by the American firm Eaton. The rotation speed of the whirler was 9000 r.p.m. and we were thus able to obtain, in 20 seconds, a thin layer of photoresist, i.e. 0.6 micrometers. This thickness can be considerably reduced by altering the viscosity of the resist by means of a solvent to be found in the shops under the name of "Microposit Thinner type 30". It should be noted that this resist is transparent for a radiation coming from a helium-neon laser the wavelength of which equals 156328 angströms.

A slight annealing of the resist was then carried out, so as to evaporate the solvents, increase the adhesion and slightly harden the resist for its transport to the tight chamber 3 of the microlithography device 1 in accordance with the invention, this transport naturally being carried out under controlled atmosphere and in a white room (for example Class 10) by means of a carrousel adapted for this use.

In accordance with the process described above and object of this invention, we then exposed the photoresist. Exposure time naturally depends on the optical power of the hight pressure lamps used as source of light 4.

The wafer was then transferred into a chamber where the photoresist had been developed by means of a product to be found in the shops under the name of "Microposit 300 Developer", then rinsed several times with deionized water and finally dried in a nitrogen atmosphere. An annealing of the resist at 90° C. for 20 minutes is then carried out.

Finally, the areas of silicon dioxide limited by the resist reserves are etched using a plasma dried lithography, the performances of which are well known.

The later observation of the wafer means of an electronic microscope, and by a near field optical microscope such as a fiber, object of the application for a French patent No. 89-11 297 mentioned above, showed that the designs of a width of 100 nanometers had been realized. The other experimental conditions of this achievement are as follows: the fiber optic 7 used both by the proximity probe 6 and as a source of radiation for the lithography presents, at its end 8 a core of 500 nanometers in diameter and a sheath of 1 micrometer in diameter—these characteristics at the end of the fiber 7 were obtained by a chemical attack and a fusion/stretching of the end of the output transmission channel 11c of an optical coupler 11 manufactured by the American firm Gould Inc., presenting a core of 4 micrometers in diameter and a sheath of 125 micrometers in diameter.

Figure 2:
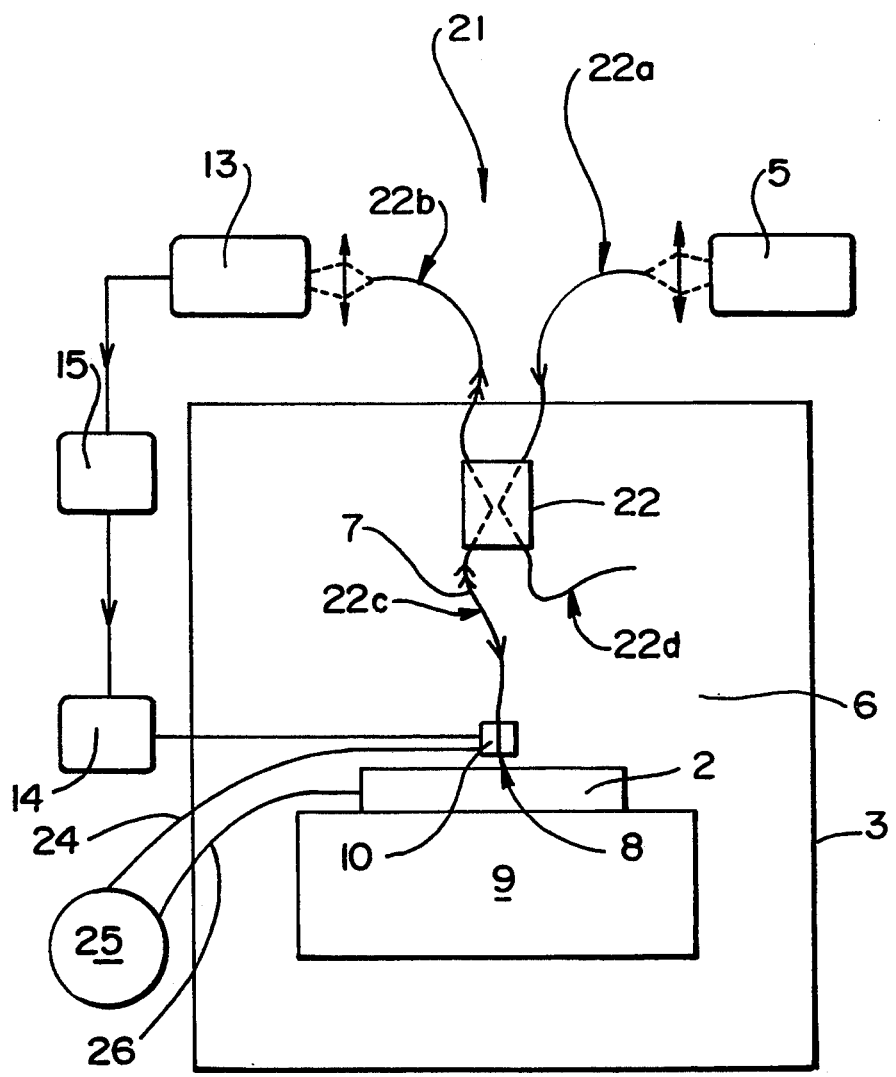
FIG. 2 is a diagram of a microlithography device according to a second variant of the invention.

We shall now describe, in reference to FIG. 2, a microlithography device 21 in accordance with the second variant of using the process, object of this invention.

In this figure, the numbers which are identical to the numbers in FIG. 1, show the identical elements which are therefore common to the two variants given as an example of the invention.

The microlithography device 21 for the realization of submicrometric structures on a substrate 2 such as a wafer thus includes:

a tight chamber 3 a source of light 5, e.g. red, of a helium-neon laser type, a proximity probe 6 working in near field and including in particular a fiber optic 7 acting at its end 8 as an optical probe, a traditional anti-vibration support 9 on which the substrate 2 is lying, a traditional vertical positioning means 10 of the end 8 of the fiber optic 7 in relation to the substrate surface 2. This positioning means 10 can also be used for the "fine" lateral positioning of the said end 8.

an optical coupler 22 with fiber optics, of a type in accordance with the optical couplers mentioned above. This optical coupler 22 includes 2 input transmission channels 22a and 22b and 2 output transmission channel 22c and 22d. The fiber optic 7 serves as the output transmission channel 22c of the coupler 22. The output transmission channel 22d is unused. The input transmission channel 22a is connected to the source of light 4, e.g. red, by a traditional and appropriate means.

a photon detector 13 such as for example a phoelectron multiplier, resistant to the light emitted by source 15. This detector 13 is coupled to the input transmission channel 22b of the optical coupler 22.

a feedback device 14, connecting the vertical positioning means 10 to a computer 15 namely controlling, depending on the intensity received by the photon detector 13, the distance between the end 8 of the fiber optic 7 and the substrate surface 2. The computer 115 also allows to control the reciprocal lateral movements of the substrate 2 and of the end 8 of the fiber 7.

Figure 3:
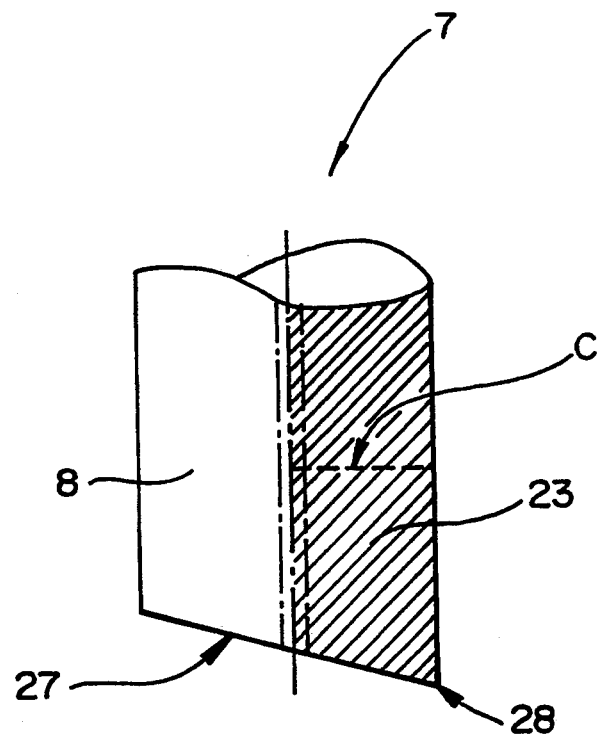
FIG. 3 is a diagram of the end of a proximity probe used in the microlithography device shown in FIG. 2.
Figure 3:
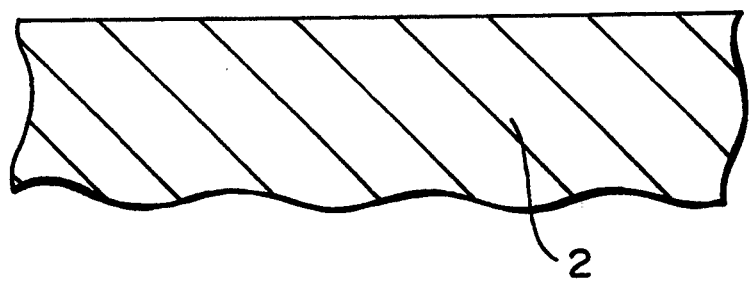

In accordance with FIG. 3 and according to a supplementary characteristic of the microlithography device 21, at least the end 8 of the fiber optic 7 of the proximity probe 6 working in near field, is metallized. The layer of metal 23 deposited on the fiber optic 7 can partially be spread round its end 8 following for example a half cylinder, the generating line of which is an arc of a circle C fictively traced around the said fiber 7. In addition, such a layer of metal 23 has a thickness which makes it transparent to the light propagating within fiber 7. In particular, it does not affect the collection, by the end 8 of the fiber 7, of the light emitted to the substrate 2 and backscattered by the latter.

The layer of metal 23 is soldered or preferably stuck with an appropriate conducting glue on the end of a fine conductor wire which is not shown in the figures. This wire ends at a connector, which is not shown either, from where a wire 24 of a larger diameter starts, crossing the tight chamber 3 in an adequate way, so as to be electrically connected to a low voltage electrical supply 25. The substrate surface 2 is also connected by an electric connector 26 to this supply 25. A slight difference in potential, of about 25 volts, can thus be applied between the layer of metal 23 and the substrate surface 2 distant from the end 8 of the fiber optic 7 metallized by a few tens of nanometers. The resulting very important electrical field, reinforced by the well-known effect called "spark effect", causes the emission of an electron current situated at the end 8 of the fiber 7.

It should be noted that in FIG. 3 we chose to show a fiber optic 7 presenting an end 8 neither stretched by a fusion/stretching process, nor narrowed to a tip by a previous chemical attack, which will be discussed further on. In accordance with FIG. 3 the output surface 24 of the fiber optic 7 is therefore flat. The direction of this surface 27, in relation to the longitudinal direction of the propagation of the light within FIG. 7 is not orthogonal, but has an angle of several degrees (3° to 4°); this specific configuration, particular to a non limited variant of the invention provides the means of delimiting part of the layer of metal 23 which partially forms a metallic tip 28. The end of this metallic tip 28 is therefore closer to the substrate surface 2 then the middle of the output side 27 of the fiber 7; this is not an inconveniency for it is sufficicient to take it into account in the feedback parameters thanks to which the proximity probe 6 works. It is therefore the metallic tip 28 that emits in this case the electrons to the substrate surface 2.

Moreover, the fact that the output surface 27 of the fiber optic 7 is not parallel to the substrate surface 2 little changes the characteristics of the measurement considering the inclination angle of this surface 27; it is also easy to take this into account—the main effect of this configuration is to reduce the level of intensity collected by the photon detector 13, but the power of the source of light 5, such as a helium-neon laser, is quite sufficient, or can be somewhat increased.

According to another variant of the realization not shown in the figures of a metallization of the end 8 of the fiber optic 7, a layer of metal covers the whole surface of the said end 8, which has previously been stretched by a fusion/stretching process known as such, then freed of part of its sheath by chemical attack (by means of an HF-type acid). Only the output surface of the fiber 7 may possibly be freed later of the deposit of metal covering it, but this is not a necessity. The advantage of this last technique for realizing a tip at the end 8 of the fiber optic 7 is to situate exactly on the same spot the light emitter used by the proximity probe 6 and a metal tip likely to emit electrons under the action of the electrical field resulting from the difference of potential supplied by the electric supply 25.

The process for using the microlithography device 21 is practically identical to that of the working process of the microlithography device 1 in accordance with the first variant described. Only the nature of the resist and the nature of its exposure change. In this way, we have replaced the positive photoresist by a resist which polymerizes under the action of an electron beam and, for example, by a negative resist of the type known under the name PMMA (this is a photopolymer widely used in the field of the invention). This resist is dissolved in chlorobenzene, then deposited in liquid phase on a wafer previously stoved and coated with an adhesion promotor agent; the resist is dispensed on a whirler rotating at 8000 rpm. After annealing the resist for 8 hours at a temperature of 175° C., a layer of PMMA resist is obtained, 20 angströms thick.

The wafer is placed within the tight chamber 3 and the positioning is carried out of the end 8 of the metallized fiber optic 7 close to the substrate surface 2. This previous positioning having been carried out, the computer 15 simultaneously orders the tripping of the electrical supply 25, and the reciprocal displacement of the end 8 of the optic fiber 7 and of the substrate 2 (i.e. trips the means of positioning integrated in the anti-vibration support 9 and the "fine" lateral positioning means integrated into the vertical positioning means 10).

25 volt electrons may thus impress the PMMA resist according to designs, the computerized description of which is supplied by the computer 15. Throughout the exposure, the proximity probe 6 keeps a distance of several tens of nanometers between the substrate surface 2 and the end 8 of the metallized fiber optic 7; it should be mentioned that the surface acting as reference to the measurement carried out by the said probe 6, to the wavelength, for example, of a light emitted by a helium-neon laser, is formed by the interface between the resist and the surface of the layer of silicon dioxide which uniformly covers the wafer. The development of the PMMA resist exposed by electrons accelerated under a difference in potential of 25 volts can be carried out with acetone (for negative resists, the development removes the exposed parts). It should be noted that for lesser energy electrons, the exposed parts can be solubilized in a methanol compound.

A classical annealing will enable to harden the resist before the parts of the wafer which have been revealed and which are delimited by "photographic" reserves are submitted to an ionic radiation intending to modify the subjacent structure of the silicone dioxide.

The designs realized in this case were observed by electronic microscopy; their size can reach 100 nanometers.

In the two variants for realizing a microlithography device using the process object of this invention, it should finally be pointed out that the linear speed of "writing" on the resist reached 1 micrometer/second.

In addition and according to a third variant of a microlithography device, not shown in the figures, but essentially in compliance with the microlithography device shown in FIG. 1, the fiber optic 7 is a fluorescent fiber, the wavelength of the fluorized light may be reaching values very much lower than the propagation limit of an optical wave in a silicon dioxide or quartz fiber (i.e. 180 nanometers). A microlithography device, in accordance with the invention, and using a fiber of this type, can, through its simplicity, compete very advantageously the microlithography processes in X-rays through extremely fine masks, difficult to realize and to position on a wafer.

It is of course obvious that the process and the microlithography devices, objects of this invention, are by no means limited by the description that has been given of them, nor by the attached drawings given solely as a non limitative example.

The field of the invention is that of the microlithography wafer substrate, in view of realizing submicrometric or even nanometric structures on its surface.

We claim:

1. Direct scanning microlithography process on a wafer-shaped substrate having a surface by at least one of an optical beam and an electronic beam for achieving photomechanical or electromechanical lithography of submicrometric structures on the surface of the substrate, the process comprising:

holding a source of at least one of an optical beam and an electronic beam for lithography at a close distance to the substrate using a waveguide proximity probe comprising a fiber optic proximity probe having an end, with the source being aligned with the end of the waveguide;

aligning a point of impact of the at least one of an optical beam and an electronic beam with a point of impact of a coherent light wave which is injected into the waveguide, so that, in positioning the end above the surface of the substrate, a coupling coefficient between a propagation mode of the waveguide and a propagation mode of an electrical field of a light wave reflected by the surface and guided in return by the waveguide, is assimilated with a rapidly decreasing function that depends upon the distance.

2. The microlithography process according to claim 1, wherein the wafer-shaped substrate includes a photoresist resin thereon, and the wavelength of light used for photomechanical lithography of the photoresist resin is different from the wavelength of the coherent light used to keep the source of the light close to the surface to be exposed by the fiber optical proximity probe.

3. The microlithography process according to claim 2, wherein radiation with a wavelength suitable for exposure of the photoresist resin is injected into the fiber optic.

4. The microlithography process according to claim 1, wherein the microlithography of the substrate is carried out by electromechanical lithography of an electroresist resin previously deposited on this substrate, the electrons being emitted, for this purpose, by a conductor tip submitted to the action of an electric field applied between the substrate and the tip, which is integral with the fiber optic proximity probe.

5. Device for microlithography of a wafer-shaped substrate for producing submicrometric structures on a surface of the substrate, comprising:
a first source of at least one of an optical beam and an electronic beam for lithography;
a second source of light;
a near field proximity probe comprising a fiber optic adapted to be positioned at a distance from the surface of the substrate;
a transmission path connecting said first source and said second source to said field proximity probe;
means for vertical positioning of the near field proximity probe;
a feedback device associated with said means for vertical positioning for aligning a point of impact of the at least one of an optical beam and an electronic beam with a point of impact of a coherent light wave which is injected into the fiber optic by said second source, so that an end of the fiber optic is positionable above the surface of the substrate with a coupling coefficient between a propagation mode of the fiber optic and a propagation mode of an electrical field of a light wave reflected by the surface and guided in return by the fiber optic is assimilated with a rapidly decreasing function that depends upon a distance of said fiber optic from the surface.

6. The microlithography device in accordance with claim 5, wherein said transmission path comprises a first optic coupler and a second optic coupler, said fiber optic being connected to an outlet transmission path at an outlet of said first optic coupler, said first optic coupler having an input transmission path connected to an outlet transmission path of said second optic coupler, said second optic coupler being connected via a first input transmission path to said first source and via a second input transmission path to said second source to obtain a joint propagation of said first source and said second source in said fiber optic.

7. The microlithography device in accordance with claim 6, wherein said fiber optic comprises a fluorescent fiber able to generate a radiation of the wavelength of X-rays.

8. The microlithography device according to claim 5, wherein the end of the fiber optic of the proximity probe is partially covered with a layer of metal forming an electron emitter when submitted by suitable polarization means to a difference of potential causing an emission of electrons at said end, the electrons being capable of being transmitted in a direction of a substrate to be engraved having a photoresist resin deposited on a surface.

9. The microlithography device according to claim 8, wherein said layer of metal comprises a thickness so as to be transparent to light propagated in the fiber optic of the proximity probe.

10. The microlithography device according to claim 8, wherein the fiber optic is a fluorescent fiber capable of generating a short wavelength radiation in order to expose the resin.

* * * * *